United States Patent
Liu et al.

(10) Patent No.: US 12,075,150 B2
(45) Date of Patent: Aug. 27, 2024

(54) UNDER-SCREEN CAMERA ASSEMBLY AND CORRESPONDING TERMINAL DEVICE

(71) Applicant: NINGBO SUNNY OPOTECH CO., LTD, Zhejiang (CN)

(72) Inventors: Siyuan Liu, Zhejiang (CN); Liao Jing, Zhejiang (CN); Xudong Wu, Zhejiang (CN)

(73) Assignee: NINGBO SUNNY OPOTECH CO., LTD, Zhejiang (CN)

( * ) Notice: Subject to any disclaimer, the term of this patent is extended or adjusted under 35 U.S.C. 154(b) by 311 days.

(21) Appl. No.: 17/599,185

(22) PCT Filed: Feb. 25, 2020

(86) PCT No.: PCT/CN2020/076574
§ 371 (c)(1),
(2) Date: Sep. 28, 2021

(87) PCT Pub. No.: WO2020/192337
PCT Pub. Date: Oct. 1, 2020

(65) Prior Publication Data
US 2022/0191367 A1 Jun. 16, 2022

(30) Foreign Application Priority Data

Mar. 28, 2019 (CN) .......................... 201910241353.3
Mar. 28, 2019 (CN) .......................... 201910241389.1

(51) Int. Cl.
*H04N 23/57* (2023.01)
*H04M 1/02* (2006.01)
(Continued)

(52) U.S. Cl.
CPC .......... *H04N 23/57* (2023.01); *H04M 1/0264* (2013.01); *H04M 1/0266* (2013.01);
(Continued)

(58) Field of Classification Search
CPC ........ H04N 23/57; H04N 23/55; H04N 23/51; H04M 1/0264; H04M 1/0266;
(Continued)

(56) References Cited

U.S. PATENT DOCUMENTS

| 10,027,865 B1 | 7/2018 | Tsai et al. |
| 2006/0152826 A1 | 7/2006 | Tsutsui |

(Continued)

FOREIGN PATENT DOCUMENTS

| CN | 1786816 | 6/2006 |
| CN | 104536179 | 4/2015 |

(Continued)

OTHER PUBLICATIONS

Extended European Search Report issued Apr. 19, 2022, in corresponding European Patent Application No. 20776698.1.
(Continued)

*Primary Examiner* — Lin Ye
*Assistant Examiner* — Tuan H Le
(74) *Attorney, Agent, or Firm* — Wenderoth, Lind & Ponack, L.L.P.

(57) ABSTRACT

The present application provides an under-screen camera assembly, including: an organic light-emitting diode display screen, a display area of which includes an under-screen camera area and a non-under-screen camera area; and a camera module, which is arranged locate at a rear end of the under-screen camera area, the camera module includes a lens barrel, a lens group and a photosensitive assembly, wherein the lens barrel includes: a lens group installation section, the lens group being installed on an inner side face of the lens group installation section; and an extension section, which is formed to extend upwards from the top of the lens group installation section, and a top surface of the extension section bearing against a bottom surface of the (Continued)

organic light-emitting diode display screen. The present application further provides a corresponding terminal device. The present application can enable the screen and the camera module to bear against each other by arranging an extension portion at the top of the lens barrel, so that the camera module can accurately align with the under-screen camera area; and the lens group of the same optical design can adapt to multiple models of terminal devices with different sizes.

17 Claims, 5 Drawing Sheets

(51) Int. Cl.
*H04N 23/55* (2023.01)
*H10K 59/121* (2023.01)
*H10K 59/65* (2023.01)

(52) U.S. Cl.
CPC .......... *H04N 23/55* (2023.01); *H10K 59/121* (2023.02); *H10K 59/65* (2023.02)

(58) Field of Classification Search
CPC ...... H10K 59/121; H10K 59/65; G03B 17/02; G03B 17/12; G03B 30/00; G09G 3/3208; G09G 2300/04; G09G 3/20
See application file for complete search history.

(56) References Cited

U.S. PATENT DOCUMENTS

| | | | |
|---|---|---|---|
| 2014/0071327 A1 | 3/2014 | Brodie et al. | |
| 2016/0343787 A1 | 11/2016 | Wu | |
| 2020/0050822 A1* | 2/2020 | Guo | G06V 10/147 |
| 2020/0310210 A1* | 10/2020 | Zhang | H10K 59/50 |
| 2021/0065625 A1* | 3/2021 | Wang | H10K 59/35 |

FOREIGN PATENT DOCUMENTS

| | | |
|---|---|---|
| CN | 106449701 | 2/2017 |
| CN | 207264695 | 4/2018 |
| CN | 108650443 | 10/2018 |
| CN | 108701231 | 10/2018 |
| CN | 108769304 | 11/2018 |
| CN | 109036245 | 12/2018 |
| CN | 109067951 | 12/2018 |
| CN | 109074491 | 12/2018 |
| CN | 109327576 | 2/2019 |
| CN | 109509781 | 3/2019 |
| EP | 3 428 967 | 1/2019 |
| WO | 2014/042804 | 3/2014 |
| WO | 2018/205804 | 11/2018 |

OTHER PUBLICATIONS

International Search Report issued May 22, 2020 in International (PCT) Application No. PCT/CN2020/076574.

* cited by examiner

UNDER-SCREEN CAMERA ASSEMBLY AND CORRESPONDING TERMINAL DEVICE

CROSS REFERENCES TO RELATED APPLICATIONS

The present application claims the priority of the Chinese patent application No. 201910241353.3 with the title of "Under-screen Camera Assembly and Corresponding Terminal Device", filed on Mar. 28, 2019, and the priority of the Chinese patent application No. 201910241389.1 with the title of "Under-screen Camera Assembly and Corresponding Terminal Device", filed on Mar. 28, 2019, and the entire content of these two applications are incorporated herein by reference.

FIELD OF THE INVENTION

The present application relates to optical imaging technology and display technology. In particular, the present application relates to an under-screen camera assembly and corresponding terminal device.

BACKGROUND OF THE INVENTION

In order to meet the camera needs of customers, electronic terminals including mobile phones usually have camera functions. For this reason, the existing mobile phone terminals generally have front and rear camera modules, and front camera modules are usually arranged on the same side of a display screen to satisfy the user's Selfie function, etc. However, as the screen-to-body ratio becomes larger and larger, higher and higher requirements are placed on a layout of the front camera.

In order to reduce the impact of the camera on the screen-to-body ratio and achieve a full screen, different manufacturers have developed a variety of solutions from different perspectives. One technical direction is to arrange the front camera module on the top frame of the mobile phone to form a notch or water drop screen that is close to the full screen. Another technical direction is to employ a telescopic camera module to hide and use the camera. When shooting is required, the camera can be controlled to extend out of the casing of the mobile phone (or other electronic device) for shooting; after the shooting is completed, the camera is retracted into the casing of the mobile phone (or other electronic device). However, the camera is prone to be impacted by external forces during a continuous expansion and contraction process, and when the camera is extended relative to the mobile phone (or other electronic device), damage may be caused to the front camera and replacement is difficult.

In recent months, some manufacturers have introduced under-screen camera solutions, commonly known as "perforated screen". The technology is: punching through holes or blind holes in the display screen, and placing the front camera module at the through holes or behind the blind holes. This technology can eliminate the need for telescopic motors and help improve product reliability. However, in this technology, the "perforated" position of the display screen cannot be used for display, resulting in insufficient visual impact, and the user experience needs to be further improved. On the other hand, in the field of display technology, organic light-emitting diode displays (i.e., OLED screens, wherein OLED is the abbreviation of Organic Light-Emitting Diode) can emit light without a backlight, and OLED screens are transparent to a certain extent. However, unlike glass, resin and other lens materials, OLED screens have complex microstructures inside. These microstructures include, for example, a large number of light-emitting structures fabricated on a substrate based on semiconductor process and corresponding micro-circuit structures for controlling the light-emitting structure. The complex microstructure inside the screen makes the light transmittance of the OLED screen to be much lower than that of glass, resin and other lens materials. If the front camera module is arranged at the back end of the existing OLED screen, the OLED screen (although it has a certain light transmittance) will still block the front camera module and cannot perform imaging.

In summary, consumers are eager for a full-screen solution. However, in the prior art, whether it is a notch, a water drop screen, a "perforated screen", or a telescopic proactive solution, all solutions have their own shortcomings. Therefore, there is an urgent need in the current market for an under-screen camera solution that can truly realize a full screen.

To solve the above problems, a solution is to specially design some regions of the OLED screen, so that the light transmittance and other related characteristics can reach a higher standard, so that the under-screen camera module can perform imaging. However, even if an OLED screen with a suitable under-screen camera region is successfully made, how to align this region with the under-screen camera module during assembly is still a big problem. Let's take a smart phone as an example for description.

The imaging of the existing camera module has nothing to do with the screen. During installation, the camera module can only be embedded on a main board of the mobile phone. However, when it is applied to the under-screen camera assembly, since the screen and the module need to be strictly aligned with a light path, they need to be assembled in a tightly matched manner. However, the distance between the main board of the mobile phone and the OLED screen is often not equal to the height of the camera module. For example, when the bottom of the camera module is installed on the main board of the mobile phone, there may be a gap between the top of the camera module and the OLED screen, which makes it very difficult to align the camera module with the light-transmitting region of the OLED screen.

Therefore, there is an urgent need for an under-screen camera solution that facilitates the accurate assembly of the OLED screen and the camera module in the current market.

SUMMARY OF THE INVENTION

The present invention is to provide a solution that can overcome at least one of the drawbacks of the prior art.

According to one aspect of the present invention, there provides an under-screen camera assembly, including: an organic light-emitting diode display screen, a display area of which includes an under-screen camera area and a non-under-screen camera area; and a camera module, an optical axis of which is perpendicular to a surface of the organic light-emitting diode display screen, and the camera module being located at a rear end of the under-screen camera area, and the camera module including a lens barrel, a lens group and a photosensitive assembly. Wherein the lens barrel includes: a lens group installation section, the lens group being installed on an inner side of the lens group installation section; and an extension section, which is formed by extending upward from a top of the lens group installation section, and a top surface of the extension section bearing against a bottom surface of the organic light-emitting diode display screen.

Wherein, the height of the extension section is determined based on a total optical length of the camera module, a distance from a photosensitive surface of the camera module to a bottom installation surface of the camera module, and a distance from the bottom installation surface of the camera module to a bottom surface of the organic light-emitting diode display screen, and the height is a size in a direction of the optical axis.

Wherein, the organic light-emitting diode display screen has a back plate; and the bottom surface of the organic light-emitting diode display screen is a bottom surface of the back plate, or a position of the back plate corresponding to the under-screen camera area is removed, and the bottom surface of the organic light-emitting diode display screen is a bottom surface of the organic light-emitting diode display screen exposed after the back plane is removed.

Wherein, top of the extension section has an extension portion formed by extending along a radial direction, so that a width of the top surface of the extension section is greater than an average thickness of the extension section, and the radial direction is a direction perpendicular to the optical axis, and the width of the top surface is a size of the top surface in the radial direction.

Wherein, the extension portion is formed by extending the top of the extension section inwardly and/or outwardly along a radial direction, and the inward direction is the direction of the optical axis.

Wherein, the lens group installation section and the extension section are manufactured based on an integral molding manufacturing process.

Wherein, the lens group installation section and the extension section are integrally molded based on an injection molding process.

Wherein, the lens barrel is made of a light-shielding material.

Wherein, the top surface of the extension section and the bottom surface of the organic light-emitting diode display screen are fixed together by adhering.

Wherein, the under-screen camera area and the non-under-screen camera area constitute a virtual diaphragm of the camera module, and the under-screen camera area forms a light through hole of the virtual diaphragm, and the non-under-screen camera area forms a light shielding portion of the virtual diaphragm.

Wherein, no physical diaphragm is arranged between each lens of the lens group.

Wherein, a pixel density of the under-screen camera area is set to be smaller than a pixel density of the non-under-screen camera area.

Wherein, a pixel pitch of the under-screen camera area is set to be greater than a pixel pitch of the non-under-screen camera area, and the pixel pitch is a pitch between light-emitting structures of adjacent pixels of the organic light-emitting diode display screen.

Wherein, the under-screen camera assembly further includes: a first control unit, which is used to control both of the under-screen camera area and the non-under-screen camera area to display images in the non-working state of the camera module; and to control the display function of the under-screen camera area to be turned off in the working state of the camera module.

Wherein, the under-screen camera assembly further includes: a second control unit, which is used to compensate brightness of the under-screen camera area when both of the under-screen camera area and the non-under-screen camera area display images.

Wherein, the under-screen camera assembly further includes: a second control unit, which is used to compensate a display parameter of the under-screen camera area when both of the under-screen camera area and the non-under-screen camera area display images, so that the displayed image transits smoothly between the under-screen camera area and the non-under-screen camera area.

According to another aspect of the present application, there also provides a terminal device, including any of the above-mentioned under-screen camera assemblies.

Wherein, the camera module is used as a front camera module of the terminal device, and the organic light-emitting diode display screen is used as a display panel on the front of the terminal device.

Compared with the prior art, the present application has at least one of the following technical effects:

1. In the present application, the extension portion can be arranged on top of the lens barrel to make the screen and the camera module bear against each other, so that the camera module can accurately align with the under-screen camera area.
2. In the present application, the extension portion can be arranged on top of the lens barrel, so that a lens group of same optical design can be adapted to multiple models of terminal devices with different sizes (for example, multiple models of mobile phones with different thicknesses).
3. In the present application, only the extension portion is arranged on top of the lens barrel, which can allow more incident-light to enter the camera module and ensure that the camera module has sufficient light input.
4. The present application can use the display screen to set the virtual diaphragm (also referred as an equivalent diaphragm) to replace a physical diaphragm set inside the camera module, thereby helping to reduce a height of the camera module and making the camera module easier to be provided under the display screen.
5. The present application can increase a light transmittance of the under-screen camera area by reducing a pixel density of the under-screen camera area, so that the screen can avoid an imaging light path of the camera module without openings to maintain integrity of the display screen.
6. In the present application, the under-screen camera area and a non-under-screen camera area (also referred to as the under-screen non-camera area) can jointly form a complete picture, truly realizing a full-screen display effect.
7. The under-screen camera assembly of the present application is particularly suitable for use in a smartphone, and the camera module in the under-screen camera assembly is particularly suitable for use as a front camera module of the smartphone.

BRIEF DESCRIPTION OF THE DRAWINGS

Exemplary embodiments are shown in the referenced drawings. The embodiments and drawings disclosed herein should be regarded as illustrative rather than restrictive.

DETAIL DESCRIPTION OF THE INVENTION

Figure 1:
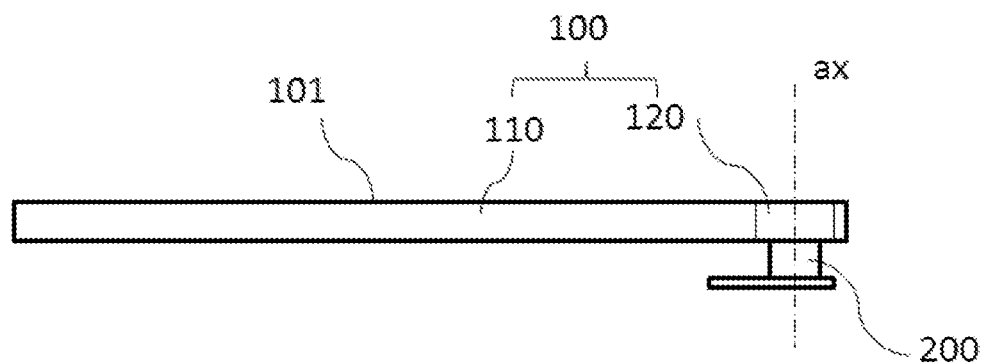
FIG. 1 shows a schematic cross-sectional view of an under-screen camera assembly according to an embodiment of the present application.

In order to better understand the present application, various aspects of the present application will be described in more detail with reference to the accompanying drawings. It should be understood that these detailed descriptions are only descriptions of exemplary embodiments of the present application, and are not intended to limit the scope of the present application in any way. Throughout the specification, the same reference numerals refer to the same elements. The expression "and/or" includes any and all combinations of one or more of the associated listed items.

It should be noted that in this specification, expressions such as first, second, etc. are only used to distinguish one feature from another feature, and do not represent any restriction on the feature. Therefore, without departing from the teachings of the present application, the first subject discussed below may also be referred to as the second subject.

In the drawings, the thickness, size, and shape of objects have been slightly exaggerated for ease of description. The drawings are only examples and are not drawn strictly to scale.

It should also be understood that the terms "comprise", "include", "have", "comprising", and/or"including", when used in this specification, mean that the stated features, wholes, steps, operations, elements, and/or components are present, but do not exclude the presence or addition of one or more other features, wholes, steps, operations, elements, components, and/or combinations thereof. In addition, when expressions such as "at least one of . . . " appear before a list of listed features, the entire listed feature is modified, rather than the individual elements in the list. In addition, when describing the embodiments of the present application, the use of "may" means "one or more embodiments of the present application". And, the term "exemplary" is intended to refer to an example or illustration.

As used herein, the terms "substantially", "approximately", and similar terms are used as approximate terms, not as terms representing degree, and are intended to illustrate inherent deviations in measured or calculated values that will be recognized by those of ordinary skill in the art.

Unless otherwise defined, all terms (including technical terms and scientific terms) used herein have the same meanings as commonly understood by those of ordinary skill in the art to which the present application belongs. It should also be understood that terms (such as those defined in commonly used dictionaries) should be interpreted as having meanings consistent with their meanings in the context of related technologies, and will not be interpreted in an idealized or excessively formal sense unless this is clearly defined in this article.

It should be noted that the embodiments in the present application and the features in the embodiments can be combined with each other if there is no conflict. Hereinafter, the present application will be described in detail with reference to the drawings and in conjunction with the embodiments.

Figure 2:
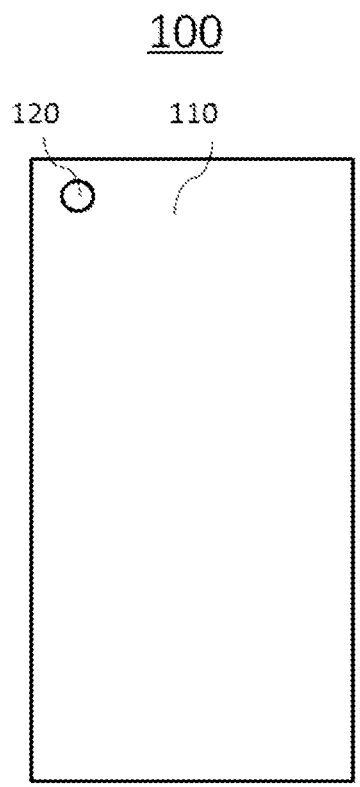
FIG. 2 shows a schematic top view of the organic light-emitting diode display screen in FIG. 1.
Figure 3:
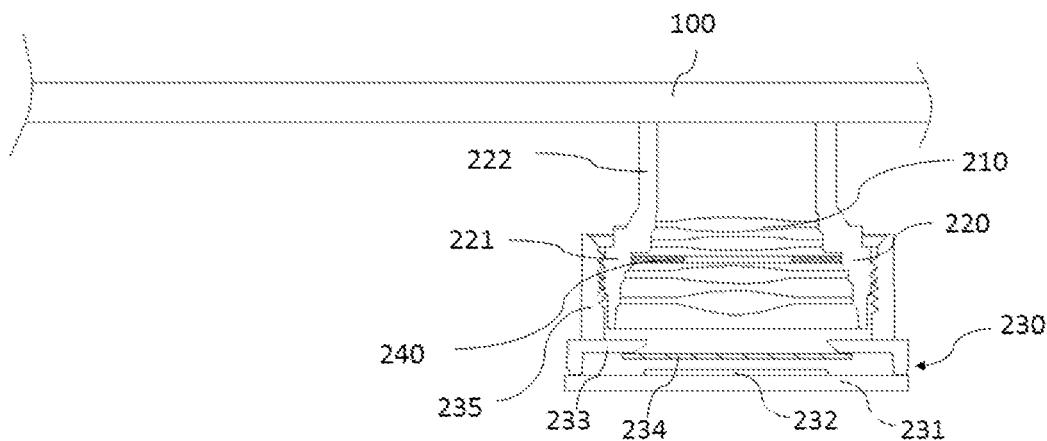
FIG. 3 shows a schematic cross-sectional view of an under-screen camera assembly with an enlarged specific structure of a camera module in an embodiment of the present application.

FIG. 1 shows a schematic cross-sectional view of an under-screen camera assembly according to an embodiment of the present application. Referring to FIG. 1, the under-screen camera assembly includes an organic light-emitting diode display screen 100 (i.e., an OLED screen) and a camera module 200 located at a rear end of the organic light-emitting diode display screen 100. An optical axis ax of the camera module 200 is substantially perpendicular to a surface 101 of the organic light-emitting diode display screen 100. Here, the "rear end" refers to an end of an imaging optical path of the camera module 200 close to an image side. The camera module 200 is located at a rear end of an under-screen camera area 120 of the organic light-emitting diode display screen 100. Herein, the under-screen camera area 120 is an area in the organic light-emitting diode display screen 100 that is adapted to the camera module 200. Further, FIG. 2 shows a schematic top view of the organic light-emitting diode display screen in FIG. 1. Referring to FIG. 2, a display area of the organic light-emitting diode display screen includes the under-screen camera area 120 and a non-under-screen camera area 110. The under-screen camera area 120 may be circular, and its size may be adapted to the size of the camera module 200. The under-screen camera area 120 may be surrounded by the non-under-screen camera area 110. In this embodiment, a pixel density of the under-screen camera area 120 (sometimes referred to as PPI in the industry, and its full name is Pixels Per Inch) is set to be smaller than a pixel density of the non-under-screen camera area 110, so as to improve a light transmittance of the under-screen camera area 120. In this way, a screen can avoid an imaging light path of the camera module without openings, so that the display screen remains intact. Moreover, since a light-emitting structure and the corresponding microcircuit can be retained, when the camera module is not used, the under-screen camera area 120 can perform image display. The under-screen camera area 120 and the non-under-screen camera area 110 can jointly form a complete picture, truly realizing the full-screen display effect. The under-screen camera assembly of this embodiment is particularly suitable for use in a smart phone, and the camera module in the under-screen camera assembly is particularly suitable for use as a front camera module of the smart phone. Further, FIG. 3 shows a schematic cross-sectional view of an under-screen camera assembly with an enlarged specific structure of a camera module in an embodiment of the present application. Referring to FIG. 3, in this embodiment, the camera module includes a lens barrel 220, a lens group 210 and a photosensitive assembly 230. In this embodiment, the lens barrel 220 includes a lens group installation section 221 and an extension section 222. Wherein, the lens group 210 is installed on an inner surface of the lens group installation section 221, and the extension section 222 is formed by extending upward from top of the lens group installation section 221, and a top surface of the extension section 222 bears against a bottom surface of the organic light-emitting diode display screen 100. In this embodiment, existence of the extension section 222 makes a first lens on top of the lens group 210 to be not close to top of the lens barrel 220, but is installed at a certain position in a middle part of the lens barrel 220. Herein, this position can be used as a boundary point between the lens group installation section 221 and the extension section 222. In this embodiment, the photosensitive assembly 230 includes a photosensitive chip 232 for collecting and outputting image data. Specifically, the photosensitive assembly 230 may include a circuit board 231, a photosensitive chip 232, a lens holder 233, a color filter 234 and a lens barrel holder 235, and the photosensitive chip 232 may be installed on (for example, attached to) a surface of the circuit board 231. The lens holder 233 is installed on a surface of the circuit board and surrounds the photosensitive chip 232, and the lens barrel holder 235 is installed on a top surface of the lens holder 233. The lens barrel holder 235 may be cylindrical with internal threads, and the lens barrel 232 may have external threads, so that the lens barrel 232 can be fixed to the lens barrel holder 235 by a threaded connection manner. The color filter 234 may be installed on the lens holder 233.

As mentioned above, when the camera module is applied to the under-screen camera assembly, since a screen and a module need to be strictly aligned with a light path, they need to be assembled in a tightly matched manner. However, a distance between a mobile phone main board and the OLED screen is often not equal to a height of the camera module. For example, when a bottom part of the camera module is installed on the mobile phone main board, there may be a gap between top of the camera module and the OLED screen, which makes it very difficult to align the camera module with a light-transmitting area of the OLED screen. A consumer electronic terminal device on the market (such as the smart phone) is pursuing thin and light, and an internal space of the device is often very compact. In mobile phone design, it is necessary to make full use of the internal space of the device to cleverly accommodate various modules and parts of the device, which is very difficult to design. Therefore, a size of the space reserved for each module in the mobile phone is often difficult to modify at will. On the other hand, the camera module is a kind of precision optical device. Under the current development trend of light and thin, the size of the camera module is getting smaller and smaller, and requirements for image quality are getting higher and higher, which leads to design and production of the camera module also facing great difficulties. For example, in order to ensure the imaging quality, it is often necessary to adjust tolerances in various aspects, such as manufacturing tolerances of each lens in the camera module and assembly tolerances brought about by lens assembling. In this case, if rashly change the design of the camera module in order to adapt to the size of the space reserved for the mobile phone, for example, adjust a total optical length (TTL) of the camera module to match a distance from the bottom surface of the display screen to the top surface of the mobile phone main board (here, the top surface can be a surface of an installation groove reserved for the mobile phone main board), then actual production of camera module products may be inconsistent with the design due to various tolerance issues. If various optical elements of the camera module are re-calibrated, it will lead to a decrease in research and development efficiency and a significant increase in product cost. In addition, in some cases, the size of the space reserved by the mobile phone may be too different from original design of the camera module. If the height of the camera module is forcibly adjusted to fit the size of the space reserved by the mobile phone, the camera module may not be able to meet conditions of optical imaging at all.

In the above-mentioned embodiment, the screen and the camera module can bear against each other by providing the extension portion on top of the lens barrel, so that the camera module can accurately align with the under-screen camera area. Moreover, the lens group of the same optical design can be adapted to multiple models of terminal devices with different sizes (for example, multiple models of the mobile phones with different thicknesses). In the above embodiment, the modification of the optical design is avoided, and only a manufacturing mold of the lens barrel (the lens barrel is usually made based on injection molding) is modified. Precision requirements and manufacturing difficulty of the lens barrel are generally lower than that of the lens (the lens is directly in the imaging optical path, even a very small tolerance may cause the image quality to be substandard), so a solution of the above embodiment can make that the camera module can be accurately aligned with the under-screen camera area and can improve research and development efficiency of the camera module and reduce cost of the product.

In order to make the technical effects of the present application easier to be understood, a comparative example is introduced below for comparison and description. When the size of the space reserved for the camera module by the mobile phone is inconsistent with an actual size of the camera module, a person of ordinary skill in the art may think of another solution, that is, a size of the camera module is not changed, an intermediary is added between the camera module and the bottom surface of the display screen to fill the gap between the top surface of the camera module and the bottom surface of the display screen. However, due to a need to assemble more components, assembly accuracy will be reduced, which may cause the camera module to be unable to accurately align with the under-screen camera area. On the other hand, when the assembled assembly or device is damaged by drop or collision, the intermediary is likely to fall, which affects reliability. In the above-mentioned embodiments of the present application, the lens barrel is directly molded through a molding process such as injection molding, which has high accuracy and high reliability.

Further, in an embodiment of the present application, the height of the extension section is determined based on a total optical length of the camera module, a distance from the photosensitive surface of the camera module (referring to a photosensitive area surface of the photosensitive chip) to a bottom installation surface of the camera module and the distance from the bottom installation surface of the camera module to the bottom surface of the organic light-emitting diode display screen, and the height is a size in a direction of the optical axis. Herein, the total optical length (TTL) refers to a distance from a center of a first incident surface of the lens group to the photosensitive surface of the photosensitive chip. The photosensitive surface is a surface of a photosensitive area of the photosensitive chip. The height of the extension section can be configured such that the size of the space reserved for the camera module by the mobile phone is consistent with the actual size of the camera module. The actual size of the camera module here mainly refers to a distance between the top surface of the lens barrel of the camera module and the bottom surface of the photosensitive assembly (usually the bottom surface of the circuit board).

Further, still referring to FIG. 3, in an embodiment of the present application, a thickness of the extension section 222 is consistent with a thickness of the top part of the lens group installation section 221. Wherein, the extension section 222 and the lens group installation section 221 are both cylindrical. The thickness here refers to a thickness in a radial direction, that is, a thickness in the direction perpendicular to the optical axis.

Figure 4:
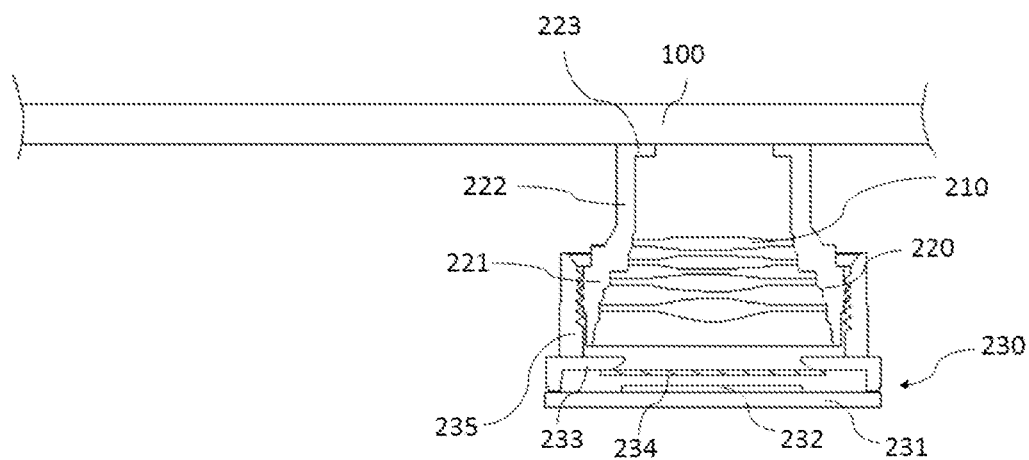
FIG. 4 shows a schematic cross-sectional view of an under-screen camera assembly with an enlarged specific structure of a camera module in another embodiment of the present application.
Figure 6:
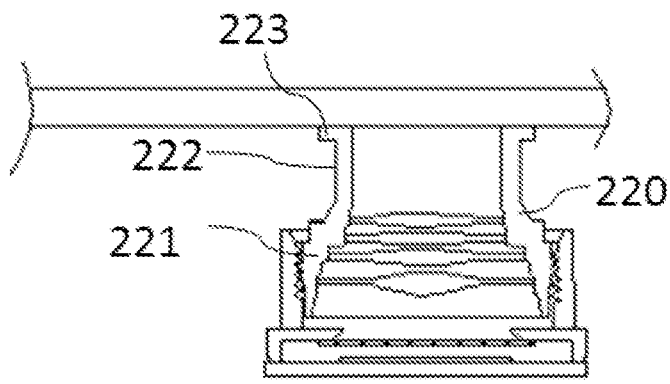
FIG. 6 shows a schematic cross-sectional view of an under-screen camera assembly according to a modified embodiment of the present application.
Figure 7:
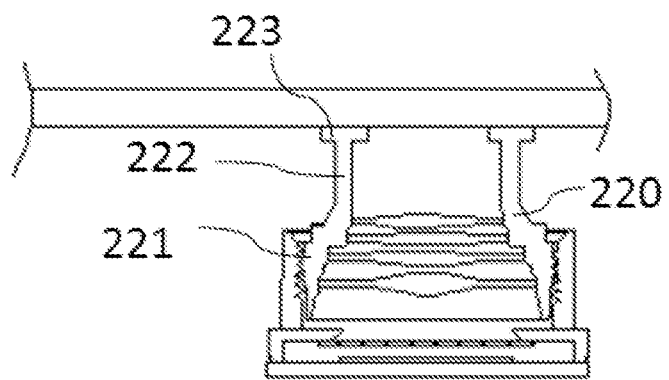
FIG. 7 shows a schematic cross-sectional view of an under-screen camera assembly according to another modified embodiment of the present application.
Figure 8:
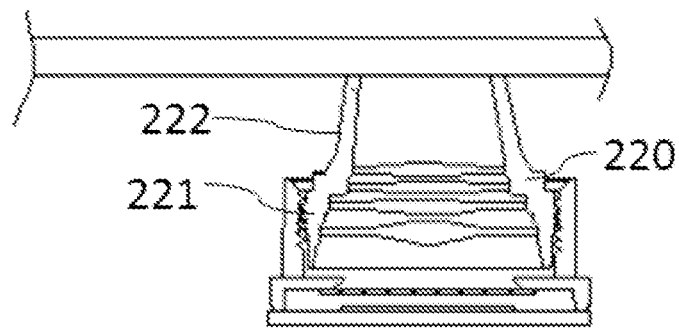
FIG. 8 shows a schematic cross-sectional view of an under-screen camera assembly according to still another modified embodiment of the present application.
Figure 9:
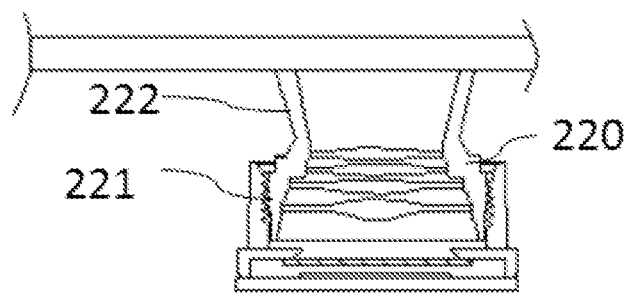
FIG. 9 shows a schematic cross-sectional view of an under-screen camera assembly according to yet another modified embodiment of the present application.
Figure 10:
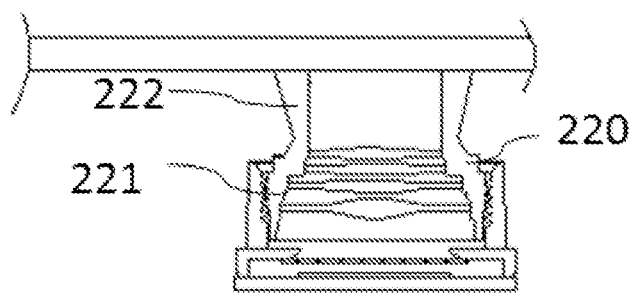
FIG. 10 shows a schematic cross-sectional view of an under-screen camera assembly according to yet another modified embodiment of the present application.

Further, FIG. 4 shows a schematic cross-sectional view of an under-screen camera assembly with an enlarged specific structure of camera module in another embodiment of the present application. Referring to FIG. 4, in this embodiment, a top part of the extension section 222 has an expansion portion 223 extending along the radial direction, so that a width of the top surface of the extension section 222 is greater than an average thickness of the extension section 222, wherein, the radial direction is a direction perpendicular to the optical axis, and the width of the top surface is a size of the top surface in the radial direction. The expansion portion 223 is formed by extending the top of the extension section 222 inward along the radial direction, wherein the inward direction is a direction toward the optical axis. In this embodiment, the expansion portion 223 can increase a bearing surface of the lens barrel 220 and the display screen (i.e., the organic light-emitting diode display screen 100), thereby making a structure of the under-screen camera assembly more stable. At the same time, in this embodiment, the extension section 222 first extends upward and then bends and extends horizontally, which can prevent part of incident light from being blocked by the extension section 222. For the under-screen camera module, incident light from outside needs to pass through the display screen, and a solution of this embodiment can ensure that the incident light passing through the display screen is not wasted, thereby ensuring maximum amount of light entering the camera module. Conversely, if simply increasing thickness of a horizontal extension portion at the top of the lens barrel (here the thickness is a size in the direction of the optical axis, that is, the axial thickness), part of the incident light will be blocked by the horizontal extension portion, resulting in the amount of light entering the camera module insufficient. Moreover, in this embodiment, a shape of the lens barrel with the extension section is basically the same as a shape of a traditional lens barrel, which helps to control manufacturing tolerances, thereby ensuring that the camera module and the display screen can be accurately aligned and assembled in actual production. It should be noted that the shape of the lens barrel provided by the embodiment shown in FIG. 4 is not unique. In other embodiments of the present application, other modified shapes of the lens barrel may also be provided. For example, FIG. 6 shows a schematic cross-sectional view of an under-screen camera assembly of a modified embodiment of the present application. The difference from the embodiment in FIG. 4 is that the expansion portion 223 of the extension section 222 in the modified embodiment is formed by extending the top of the extension section 222 outward along the radial direction. FIG. 7 shows a schematic cross-sectional view of an under-screen camera assembly of another modified embodiment of the present application. The difference from the embodiment in FIG. 4 is that the expansion portion 223 of the extension section 222 in this modified embodiment is formed by extending the top of the extension section 222 inward and outward at the same time along the radial direction. FIG. 8 shows a schematic cross-sectional view of an under-screen camera assembly of another modified embodiment of the present application. In this modified embodiment, an aperture of a light through hole of the extension section 222 of the lens barrel 220 is gradually reduced, wherein the aperture of the light through hole of the extension section 222 near one end of the lens group installation section 221 is larger than that of the extension section 222 near one end of the display screen. FIG. 9 shows a schematic cross-sectional view of an under-screen camera assembly of yet another modified embodiment of the present application. In this modified embodiment, the aperture of the light through hole of the extension section 222 of the lens barrel 220 is gradually increased, and the aperture of the light through hole of the extension section 222 near one end of the lens group installation section 221 is smaller than that of the extension section 222 near one end of the display screen. FIG. 10 shows a schematic cross-sectional view of an under-screen camera assembly of yet another modified embodiment of the present application. In this modified embodiment, the thickness of the extension section 222 of the lens barrel 220 is gradually increased, and the thickness of the extension section 222 near one end of the lens group installation section 221 is smaller than that of the extension section 222 near one end of the display screen, and the aperture of the light through hole of the extension section 222 (that is, an inner diameter of the extension section) can be kept consistent. In this modified embodiment, since the thickness of the top of the extension section 222 is increased, the bearing surface between the lens barrel and the display screen can be increased, thereby making the structure of the under-screen camera assembly more stable.

Further, in an embodiment of the present application, the lens group installation section and the extension section are made based on an integral molding manufacturing process. The integral molding manufacturing process may be an integral molding based on an injection molding process.

Further, in an embodiment of the present application, the lens barrel may be made of a light-shielding material to form a so-called "black object".

Further, in an embodiment of the present application, the top surface of the extension section and the bottom surface of the organic light-emitting diode display screen are fixed together by adhering.

Further, in an embodiment of the present application, a bottom part of the organic light-emitting diode display screen has a back plate, and the back plate can play a role of protection and support. The bottom surface of the organic light-emitting diode display screen may be a bottom surface of the back plate.

Figure 5:
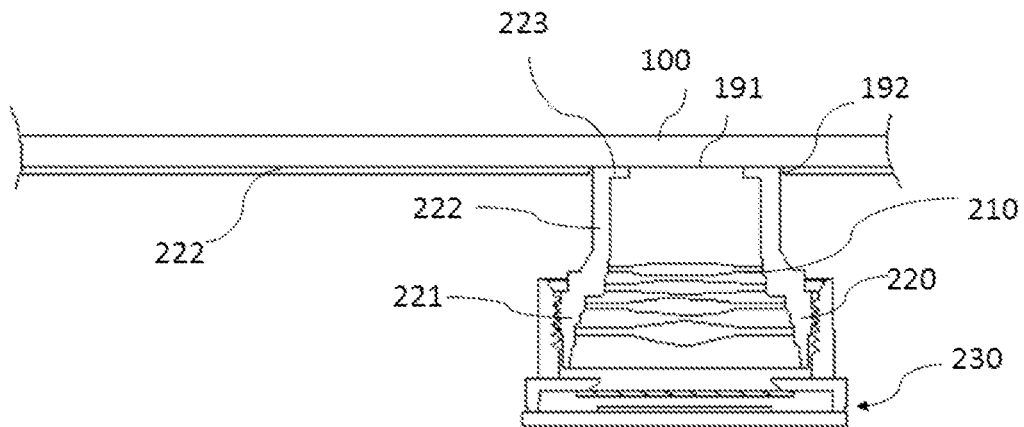
FIG. 5 shows a schematic cross-sectional view of an under-screen camera assembly with a perforated back plate in an embodiment of the present application.

Further, FIG. 5 shows a schematic cross-sectional view of an under-screen camera assembly with an perforated back plate in an embodiment of the present application. Referring to FIG. 5, in this embodiment, the organic light-emitting diode display screen 100 includes a back plate 190. A position of the back plate 190 corresponding to the under-screen camera area can be removed, so as to increase the light transmittance of the under-screen camera area. At this time, the bottom surface of the organic light-emitting diode display screen 100 may be a bottom surface 191 exposed after the back plate of the organic light-emitting diode display screen is removed. In other words, when the position of the back plate 190 corresponding to the under-screen camera area is removed, a groove is formed on the bottom surface of the organic light-emitting diode display screen, and the extension section of the camera module can extend into the groove. In addition, the top surface of the extension section can bear against a bottom surface of the groove (i.e., the bottom surface 191). Further, in an embodiment, on the basis that the top surface of the extension section 222 bears against the bottom surface 191 of the groove, an outer surface of the extension section 222 may also bear against a side wall of the groove, so that the structure of the under-screen camera assembly is more stable.

Further, still referring to FIG. 3, in an embodiment of the present application, a physical diaphragm 240 is arranged between each lens of the lens group 210 of the camera module. In this embodiment, the physical diaphragm 240 is arranged between a second lens and a third lens. It should be noted that in other embodiments of the present application, the physical diaphragm 240 may also be arranged on other positions, for example, between the first lens and the second lens, or between the third lens and a fourth lens, or other situations, it will not be exhaustive herein.

Further, in an embodiment of the present application, the physical diaphragm may be a variable diaphragm, and a size of an aperture of the diaphragm can be adjusted.

Further, in an embodiment of the present application, the under-screen camera area and the non-under-screen camera area constitute a virtual diaphragm of the camera module, wherein the under-screen camera area forms a light through hole of the virtual diaphragm, and the non-under-screen camera area forms a light-shielding portion of the virtual diaphragm. No physical diaphragm is arranged between each lens of the lens group.

Further, in an embodiment of the present application, a pixel density of the under-screen camera area is set to be smaller than a pixel density of the non-under-screen camera area. A pixel pitch of the under-screen camera area is set to be greater than a pixel pitch of the non-under-screen camera area, wherein the pixel pitch is a pitch between light-emitting structures of adjacent pixels of the organic light-emitting diode display screen.

Further, in an embodiment of the present application, the under-screen camera assembly further includes: a first control unit, which is used to control both of the under-screen camera area and the non-under-screen camera area to display images in a non-working state of the camera module; and to control a display function of the under-screen camera area to be turned off in a working state of the camera module. In the area where the display function is turned off (such as the under-screen camera area), a light-emitting layer of each pixel does not emit light, so that when the module is shooting, there will be no stray light from the display screen that affects image shooting. During shooting, the non-under-screen camera area can display all images; it is also possible not to display image in a surrounding area surrounding the under-screen camera area (that is, the light-emitting layer of the pixels in the surrounding area does not emit light), and remaining part displays the image. For example, when the under-screen camera assembly is applied to the smart phone, when the smart phone calls a front camera, the first control unit can turn off the display function of the under-screen camera area on the screen (that is, the under-screen camera area does not light), so that external light can pass through the under-screen camera area and be received by the front camera. Since many improvements in the under-screen camera area can increase its light transmittance, the amount of light entering the front camera can reach the standard for effective imaging. At the same time, the non-under-screen camera area of the screen can still work in order to display the picture taken by the front camera for better taking pictures (for example, the non-under-screen camera area displays the face image during selfie) or videos (for example, during a video conference, the corresponding image is displayed in the non-screen camera area). In this embodiment, the first control unit may be configured in an operating system or application of the mobile phone (or other terminal device), or may be implemented as a part of a display driving circuit.

Further, in an embodiment of the present application, the under-screen camera assembly further includes a second control unit, which is used to compensate a display parameter of the under-screen camera area when both of the under-screen camera area and the non-under-screen camera area display images. In this embodiment, in order to increase the amount of light entering the camera module, the pixel density of the under-screen camera area (sometimes referred to as PPI in the industry, and its full name is Pixels Per Inch) is set to be smaller than that of the non-under-screen camera area. It should be noted that in the present application, a lower pixel density of the under-screen camera area is set to increase the pixel pitch. Therefore, in the under-screen camera area, the light-emitting surface per unit area may be reduced, which may cause the brightness of the under-screen camera area decreases (referring to the lower brightness of the under-screen camera area compared to the non-under-screen camera area). If the brightness of the under-screen camera area is not compensated, then in a full-screen display, although a position of the front camera module can display images, its brightness may be significantly lower, so comparing with the surrounding non-screen camera area, this position (the position of the front camera module) may form a dark spot (that is, areas with significantly lower brightness than the surrounding areas). Such dark spots may be easily noticed by users visually, thereby affecting user experience. Based on the above analysis, it can be seen that using the second control unit to compensate the brightness of the under-screen camera area in this embodiment can eliminate or suppress the aforementioned dark spots caused by the increase in the pixel pitch of the under-screen camera area. Here, the compensation for the brightness may be compensation at the software level, for example, adaptive adjustment at an operating system level or application level of the mobile phone (or other terminal device). For example, through software adjustment, the brightness of the under-screen camera area is increased, so as to be consistent with the surrounding non-under-screen camera area, thereby eliminating or suppressing dark spots in the under-screen camera area. In this way, a user can see a complete screen and complete and continuous images displayed on the screen and obtain an extremely shocking visual enjoyment. Of course, the brightness of the under-screen camera area can also be compensated in the display driving circuit. It should be noted that, in another embodiment of the present application, it can also be realized by TFT in the under-screen camera area (that is, a thin film transistor switch under the light-emitting layer of each pixel) that the brightness per unit area of the under-screen camera area is equal to that of other areas (that is, the non-screen camera area), so as to realize the compensation of the brightness of the under-screen camera area. That is, the second control unit can be implemented at a hardware level of the display screen.

Further, it should be noted that since many improvements have been made to increase the transmittance of the under-screen camera area, in addition to the brightness, there may be other differences in its display effect compared with the non-under-screen camera area. For example, due to many improvements to increase the transmittance of the under-screen camera area, other display parameters such as contrast of the under-screen camera area may change, as a result, a certain boundary may be formed between the under-screen camera area and the non-under-screen camera area due to this change. If this kind of boundary is easy to be noticed by a human eye, it may also make people feel that an image displayed on the screen is incomplete and discontinuous, and the visual effect of the full screen may be compromised. Based on the above analysis, in an embodiment of the present application, the under-screen camera assembly further includes a second control unit, which is used to compensate a display parameter of the under-screen camera area when both of the under-screen camera area and the non-under-screen camera area display images, so that the displayed image transits smoothly between the under-screen camera area and the non-under-screen camera area, thus, the under-screen camera area and the non-under-screen camera area can form a complete and continuous picture, and there is no boundary between the under-screen camera area and the non-under-screen camera area in the picture that is easy to be noticed by a naked eye. Compensating the display parameters of the under-screen camera area may be compensation at the software level, for example, adaptive adjustment at the operating system level or application level of the mobile phone (or other terminal device). Of course, the display parameters of the under-screen camera area can also be compensated at the display driving circuit. Display parameters can include brightness and contrast.

Further, in an embodiment of the present application, a pixel size of the under-screen camera area is the same as a pixel size of the non-under-screen camera area. The pixel size here refers to a size of the light-emitting structure. Under this design, the under-screen camera area and the non-under-screen camera area can share many production processes and production devices, which help to improve production efficiency and increase yield. It should be noted that in other embodiments of the present application, the pixel size of the under-screen camera area and the pixel size of the non-under-screen camera area may also be different. Reducing the pixel density of the under-screen camera area can help increase the spacing between pixels, thereby increasing the transmittance of the under-screen camera area.

Further, in an embodiment of the present application, a terminal device is also provided, which includes the under-screen camera assembly described in any of the foregoing embodiments. The camera module may be used as a front camera module of the terminal device, and the organic light-emitting diode display screen may be used as a display panel on the front of the terminal device.

Pixel density (PPI) herein is sometimes referred as display density.

In the under-screen camera assembly of the above embodiment, the extension portion is arranged on the top of the lens barrel of the camera module, but it should be noted that the present application is not limited to this. For example, in some embodiments of the present application, the pixel density of the under-screen camera area 120 may be set to be smaller than the pixel density of the non-under-screen camera area 110, so as to increase the light transmittance of the under-screen camera area 120, so that the under-screen camera area and the non-under-screen camera area can form a complete picture together, and then the full-screen display effect is truly realized (that is, the full-screen is realized by reducing the PPI of the under-screen camera area). There is no restriction on the way of assembling the camera module and the display screen. Accordingly, the top of the lens barrel of the camera module may not be arranged with the extension portion.

Specifically, still referring to FIG. 1, the under-screen camera assembly includes the organic light-emitting diode display screen 100 (i.e., an OLED screen) and the camera module 200 located at the rear end of the organic light-emitting diode display screen 100. The optical axis ax of the camera module 200 is substantially perpendicular to the surface 101 of the organic light-emitting diode display screen 100. Here, the "rear end" refers to the end of the imaging optical path of the camera module 200 close to the image side. The camera module 200 is located at the rear end of the under-screen camera area 120 of the organic light-emitting diode display screen 100. Wherein, the under-screen camera area 120 is the area in the organic light-emitting diode display screen 100 that is adapted to the camera module 200. Further, still referring to FIG. 2, the display area of the organic light-emitting diode display screen includes the under-screen camera area 120 and the non-under-screen camera area 110. The under-screen camera area 120 may be circular, and its size may be adapted to the size of the camera module 200. The under-screen camera area 120 may be surrounded by the non-under-screen camera area 110. In this embodiment, the pixel density of the under-screen camera area 120 (sometimes referred to as PPI in the industry, and its full name is Pixels Per Inch) is set to be smaller than the pixel density of the non-under-screen camera area 110, so as to improve the light transmittance of the under-screen camera area 120. In this way, it is possible to avoid punching holes on the screen to avoid the imaging light path of the camera module, thereby keeping the display screen intact. Moreover, since the light-emitting structure and the corresponding microcircuit can be retained, when the camera module is not used, the under-screen camera area 120 can perform image display. The under-screen camera area 120 and the non-under-screen camera area 110 can jointly form a complete picture, truly realizing the full-screen display effect. The under-screen camera assembly of this embodiment is particularly suitable for use in the smart phone, and the camera module in the under-screen camera assembly is particularly suitable for use as a front camera module of the smart phone.

Figure 11:
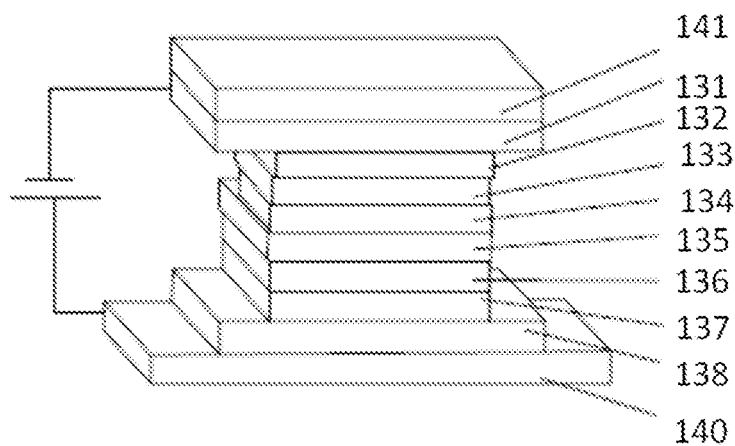
FIG. 11 shows a schematic diagram of a circuit structure of a single pixel in an embodiment of the present application.

Further, in an embodiment of the present application that realizes the full screen by reducing the PPI of the under-screen camera area, the pixel pitch of the under-screen camera area 120 is set to be greater than the pixel pitch of the non-under-screen camera area 110, the pixel pitch is the pitch between the light-emitting structures of adjacent pixels of the organic light-emitting diode display screen 100. In order to better understand the essence of this embodiment, the specific structure of the organic light-emitting diode display screen will be described below in conjunction with the accompanying drawings (it should be noted that these specific structures can also be applied to those embodiments with the extension portion on the top of the lens barrel described above). FIG. 11 shows a schematic diagram of a circuit structure of a single pixel in an embodiment of the present application. Referring to FIG. 11, in this embodiment, the organic light-emitting diode display screen 100 includes a cathode layer 131, an electron injection layer 132, an electron transport layer 133, a light-emitting layer 134, a hole transport layer 135, a hole injection layer 136, a buffer layer 137 from the rear end to the front end (from top to bottom in FIG. 11). In this embodiment, the organic light-emitting diode display screen 100 emits light from a side of the anode 138. Therefore, the anode 138 is located at the front end and the cathode layer 131 is located at the rear end. Here, the front end refers to the end of the imaging optical path of the camera module close to the object, and the rear end refers to the end of the imaging optical path of the camera module close to the image. When making the organic light-emitting diode display screen 100, the anode 138, the buffer layer 137, the hole injection layer 136, the hole transport layer 135, the light-emitting layer 134, the electron transport layer 133, the electron injection layer 132 and the cathode layer 131 are sequentially made on a substrate 140. An upper surface of the cathode layer 131 can be further fabricated with a cover plate 141. It should be noted that in other embodiments of the present application, the organic light-emitting diode display screen 100 may emit light from a side of the cathode layer 131, at this time, the cathode layer 131 is located at the front end, and the anode 138 is located at the rear end. In this embodiment, the non-under-screen camera area 110 and the under-screen camera area 120 may both have the above structures, but the microstructure inside the under-screen camera area 120 can be specially designed to increase the light transmittance. In the under-screen camera area 120 of this embodiment, for the single pixel, the light-emitting layer 134 can be made in a groove. For example, when making a lower layer structure of the light-emitting layer 134, the lower layer structure can be made into the groove. The light-emitting layer 134 is formed at a bottom part of the groove, and a depth of the groove is greater than a height of the light-emitting layer 134. And a side wall of the groove may be inclined and a side wall of a pixel isolation layer may be formed on the basis of the side wall of the groove. Wherein, for the display screen that emits light from the anode, an underlying structure of the light-emitting layer 134 may be the electron transport layer 133, and for the display screen that emits light from the cathode, the underlying structure of the light-emitting layer 134 may be the hole transport layer 135. Further, for the entire screen, the light-emitting layer 134 may be separated by the buffer layer 137 to form a plurality of the pixels. The buffer layer 137 may be insulating. The buffer layer 137 can prevent holes from being transported to the organic/metal cathode interface to cause quenching of light. Compared with the light-emitting structure, the buffer layer 137 has a higher light transmittance. The gap between pixels is mainly composed of the cathode layer 131 and the buffer layer 137. In this embodiment, the pixel pitch of the under-screen camera area 120 is increased (for example, the pixel pitch of the under-screen camera area is set to be greater than the pixel pitch of the non-under-screen camera area), so that more light can pass through from the gap between the pixels (mainly composed of the cathode layer 131, the buffer layer 137 and the anode 138 with larger light transmittance), thereby increasing the amount of light entering the camera module located at the rear end of the under-screen camera area, thereby making the camera module to take images through an organic light-emitting diode display screen. It should be noted that although in the above embodiment, the gap between pixels includes the cathode layer 131 and the buffer layer 137, the present application is not limited thereto. For example, in another embodiment of the present application, the gap between pixels may only include the buffer layer 137, may also include the cathode layer 131, the buffer layer 137 and the anode 138 (sometimes may also be referred to as an anode layer). But no matter what, the light transmittance of the gap between the pixels (referring to the overall light transmittance of the screen from the top surface to the bottom surface) is greater than the light transmittance of the pixel light-emitting structure position (referring to the overall light transmittance of the screen from the top surface to the bottom surface).

Further, in an embodiment of the present application that realizes the full screen by reducing the PPI of the under-screen camera area, in the under-screen camera area, the position of the cathode layer corresponding to the gap between the pixels has a light through groove. Wherein, the gap between pixels can be understood as the gap between the light-emitting structures of adjacent pixels. In this embodiment, the cathode layer has a design of the light through groove, which can further increase the light transmittance of the gap between the light-emitting structures of adjacent pixels. Specifically, a material of the cathode layer of the organic light-emitting diode display screen is generally an alloy with more active properties (low work function, easy to release electrons), and its light transmittance is relatively low. It is difficult to increase the transmittance by changing a cathode material. Thinning it can increase a certain transmittance, but a too thin cathode will affect the performance and yield of the organic light-emitting diode display screen. In this embodiment, the light through groove is arranged in the cathode layer corresponding to the position of the pixel dot gap to increase the transmittance, which can increase the light transmittance of the under-screen camera area while ensuring performance and yield. The solution of this embodiment can be applied in combination with foregoing embodiments in which the extension portion is arranged on the top of the lens barrel.

Further, in an embodiment of the present application for realizing the full screen by reducing the PPI of the under-screen camera area, the organic light-emitting diode display screen further includes a back plate film, and in the under-screen camera area, a position of the back plate film corresponding to the gap between the pixels has a light through groove. Wherein, the gap between pixels can be understood as the gap between the light-emitting structures of adjacent pixels. In this embodiment, the back plate film has a light through groove design, which can further increase the light transmittance of the gap between the light-emitting structures of adjacent pixels. The solution of this embodiment can be applied in combination with the foregoing embodiments in which the extension portion is arranged on the top of the lens barrel.

Further, in an embodiment of the present application that realizes the full screen by reducing the PPI of the under-screen camera area, in the under-screen camera area, the anode is made based on a nanowire process (refer to the disclosure of patent document CN 201510069596.5), and the anode is attached to the buffer layer. In the prior art, an anode of the organic light-emitting diode display screen is usually ITO conductive glass. It is made by coating a layer of indium tin oxide (commonly known as ITO) film by sputtering, evaporation and other methods to conduct circuit conduction. In order to increase the light transmittance, a nano conductive structure such as a silver nanowire can be used instead of the ITO to increase the transmittance. The silver nanowire is a nano-scale conductive wire that can be used to make an ultra-small circuit. In addition to excellent electrical conductivity, it also has excellent light transmittance due to the nano-level size effect. For example, at 10 nm, a haze degree of the nanowires is only 0.2% (the greater the haze degree is, the lower the gloss and transparency of the film is), and the nanowire is also resistant to flexure, which is more suitable for high light transmittance and flexible organic light emitting diode screen. The solution of this embodiment can be applied in combination with foregoing embodiments in which the extension portion is arranged on the top of the lens barrel.

Figure 12:
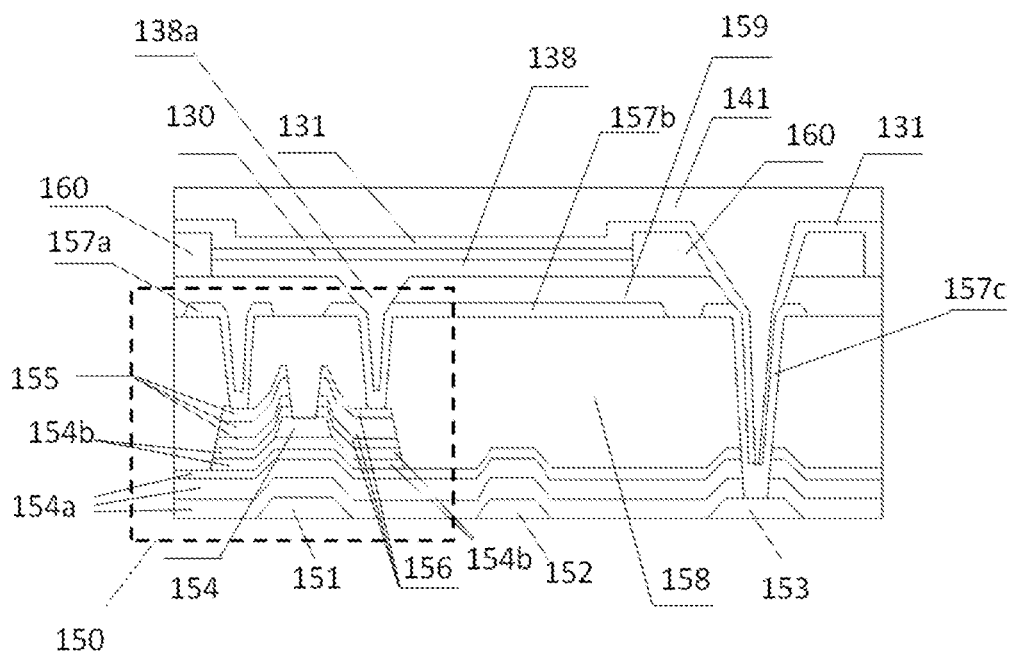
FIG. 12 shows a schematic cross-sectional view of an under-screen camera area of an organic light-emitting diode display screen including a TFT layer in an embodiment of the present application.

Further, FIG. 12 shows a schematic cross-sectional view of an under-screen camera area of an organic light-emitting diode display screen including a TFT layer in an embodiment of the present application. Referring to FIG. 12, in the present application, the organic light-emitting diode display screen also includes the TFT layer (TFT's full name is Thin Film Transistor, which may be referred as a thin film transistor). In the under-screen camera area, the TFT layer includes a TFT switch unit 150, a storage capacitor 152, and a contact 153 (sometimes referred as an auxiliary electrode or a contact area). Moreover, each TFT switch unit 150 may correspond to one pixel (or it may be understood that each TFT switch unit 150 corresponds to a light-emitting structure 130, and the TFT switch unit 150 may be regarded as a control structure of the corresponding pixel). The TFT switch unit 150 may be located directly below the corresponding light-emitting structure 130. In other words, the TFT switch unit 150 may overlap or partially overlap with its corresponding light-emitting structure 130 in a top view. And the contact 153 corresponding to the TFT switch unit 150 is arranged at the position of the gap between adjacent pixels. In other words, the contact is arranged directly below the gap between adjacent light-emitting structures. In the TFT layer, the contact 153 is usually used to realize electrical connection with the light-emitting structure on the upper layer or a conductive layer on an upper surface of the TFT unit. Therefore, the structure above the contact is usually simple. For example, a groove (or referred as a via) can be formed above the contact, the groove is used to attach a conductive nanowire 157c and/or the cathode 131 of the light-emitting structure 130 (based on the groove, the cathode 131 can be conducted to the contact 153 through the conductive nanowire 157c, or the cathode 131 directly contacts the contact 153 to conduct the two). The groove can be filled with the material of the cover plate 141. Since the cover plate 141 can be formed of a material with high light transmittance, the contact 153 and the area corresponding to the groove above it have good light transmittance. Arranging the contact 153 in the position of the gap between adjacent pixels can prevent the incident light passing through the pixel dot gap from being blocked more, thereby increasing the overall light transmittance of the screen and increasing the amount of light entering the camera module. Further, still referring to FIG. 12, in this embodiment, the TFT switch unit 150 includes a gate 151, a source 155, and a drain 156, wherein the gate 151 has a buffer layer 154a and a trench 154b. The buffer layer 154a can also cover the storage capacitor 152. In this embodiment, the drain 156 and the source 155 are both located on an upper surface of the trench 154b, wherein the drain 156 can be located on a right side and the source 155 can be located on a left side, a gap between the two can be filled by a second buffer Layer 158. A material of a third buffer layer 154 may be consistent with that of the second buffer layer 158. It should be noted that when the gate 151 is applied with a turn-on signal, the trench 154b can be turned on, and when the gate 151 is not applied with a turn-on signal, the trench 154b is insulated. Both the drain 156 and the source 155 can be composed of a multi-layer structure, but these specific details can be completely consistent with the prior art, and these specific details have nothing to do with the subject matter of the present application, and therefore will not be repeated here. In this embodiment, a conductive layer may be arranged on the top of the TFT switch unit 150 to facilitate electrical connection between the TFT switch unit 150 and the light-emitting structure 130. The conductive layer on the top of the TFT switch unit 150 may be an ITO layer. In a preferred embodiment, a conductive nanowire can be used to replace the ITO layer to further improve the light transmittance. Specifically, the top surfaces of the drain 156 and the source 155 are connected to the nanowires 157a and 157b, and the drain 156 and the source 155 are separated from the light-emitting structure 130 above by a third buffer layer 159. The anode 138 of the light-emitting structure 130 may communicate with the nanowire 157b through the via 138a, and then communicate with the source 155. It should be noted that the specific internal structure of the light-emitting structure 130 is not shown in FIG. 12. In this embodiment, the light-emitting structure 130 may include a hole injection layer 136, a hole transport layer 135, a light-emitting layer 134, an electron transport layer 133, and an electron Injection layer 132 (refer to FIG. 11). In addition, the light-emitting structure may further include a buffer layer 137 between the anode 138 and the hole injection layer 136 (refer to FIG. 11). In this embodiment, the light-emitting structures 130 of adjacent pixels may be separated by a pixel defining layer 160. The pixel defining layer 160 may be made of organic materials with good light transmittance. The top of the light-emitting structure 130 may also be covered with an insulating layer to form the cover plate 141. In this embodiment, the light transmittance of incident light from the outside can be improved through the design of the position of the contact of the TFT layer. The solution of this embodiment can be applied in combination with forgoing embodiments in which the extension portion is arranged on the top of the lens barrel.

Further, in an embodiment of the present application in which a full screen is realized by reducing the PPI of the under-screen camera area, the under-screen camera assembly further include: a first control unit, which is used to control both of the under-screen camera area and the non-under-screen camera area to display images in the non-working state of the camera module; and to control the display function of the under-screen camera area to be turned off in the working state of the camera module. In the area where the display function is turned off (such as the under-screen camera area), a light-emitting layer of each pixel does not emit light, so that when the module is shooting, there will be no stray light from the display screen that affects the image shooting. During shooting, all of the non-under-screen camera area can display images; it is also possible not to display image in a surrounding area surrounding the under-screen camera area (that is, the light-emitting layer of the pixels in the surrounding area does not emit light), and the remaining part displays the image. For details, please refer to the description of the first control unit in the corresponding embodiment above, which will not be repeated here. Further, in an embodiment of the present application that realizes a full screen by reducing the PPI of the under-screen camera area, the under-screen camera assembly further includes: a second control unit, which is used to compensate a brightness of the under-screen camera area when both of the under-screen camera area and the non-under-screen camera area display images. For details, please refer to the description of the second control unit in the corresponding embodiment above, which will not be repeated here. Further, in another embodiment of the present application, the under-screen camera assembly further include a second control unit, which is used to compensate a parameter of the under-screen camera area when both of the under-screen camera area and the non-under-screen camera area display images, so that the displayed image transits smoothly between the under-screen camera area and the non-under-screen camera area, thus, the under-screen camera area and the non-under-screen camera area can form a complete and continuous picture, and there is no boundary between the under-screen camera area and the non-under-screen camera area in the picture that is easy to be noticed by the naked eye. Compensating the display parameter of the under-screen camera area may be compensation at the software level, for example, adaptive adjustment at the operating system level or application level of the mobile phone (or other terminal device). Of course, the display parameter of the under-screen camera area can also be compensated at the display driving circuit. Display parameters can include brightness and contrast.

Further, in an embodiment of the present application for realizing the full screen by reducing the PPI of the under-screen camera area, the pixel size of the under-screen camera area is the same as the pixel size of the non-under-screen camera area. The pixel size here refers to the size of the light-emitting structure. Under this design, the under-screen camera area and the non-under-screen camera area can share many production processes and production equipment, which helps to improve production efficiency and increase yield. It should be noted that in other embodiments of the present application, the pixel size of the under-screen camera area and the pixel size of the non-under-screen camera area may also be different. Reducing the pixel density of the under-screen camera area can help increase the spacing between pixels, thereby increasing the transmittance of the under-screen camera area.

Further, in an embodiment of the present application in which the full screen is realized by reducing the PPI of the under-screen camera area, a terminal device is also provided, which includes the under-screen camera assembly described in any of the preceding embodiments. The camera module may be used as the front camera module of the terminal device, and the organic light-emitting diode display screen may be used as the display panel on the front of the terminal device.

The above description is only a preferred embodiment of the present application and an explanation of the applied technical principles. Those skilled in the art should understand that the scope of the invention involved in this application is not limited to the technical solution formed by the specific combination of the above technical features, and should also cover other technical solutions formed by any combination of the above technical features or its equivalent features without departing from the inventive concept, for example, a technical solution formed by the above-mentioned features and the technical features disclosed in this application (but not limited to) with similar functions mutually replaced.

The invention claimed is:

1. An under-screen camera assembly, characterized by comprising:
   an organic light-emitting diode display screen, the display area of which includes an under-screen camera area and a non-under-screen camera area; and
   a camera module, the optical axis of which is perpendicular to a surface of the organic light-emitting diode display screen, and the camera module being located at a rear end of the under-screen camera area, the camera module including a lens barrel, a lens group and a photosensitive assembly, wherein the lens barrel includes:
   a lens group installation section, the lens group being installed on an inner side of the lens group installation section; and
   an extension section, which is formed by extending upward from top of the lens group installation section, and a top surface of the extension section bearing against a bottom surface of the organic light-emitting diode display screen;
   wherein, the lens group installation section and the extension section are manufactured based on an integral molding manufacturing process.

2. The under-screen camera assembly according to claim 1, wherein, the height of the extension section is determined based on a total optical length of the camera module, a distance from a photosensitive surface of the camera module to a bottom installation surface of the camera module, and a distance from the bottom installation surface of the camera module to a bottom surface of the organic light-emitting diode display screen, and the height is a size in a direction of the optical axis.

3. The under-screen camera assembly according to claim 1, wherein, the organic light-emitting diode display screen has a back plate; and the bottom surface of the organic light-emitting diode display screen is a bottom surface of the back plate, or a position of the back plate corresponding to the under-screen camera area is removed, and the bottom surface of the organic light-emitting diode display screen is a bottom surface of the organic light-emitting diode display screen exposed after the back plate is removed.

4. The under-screen camera assembly according to claim 1, wherein, top of the extension section has an extension portion formed by extending along a radial direction, so that a width of the top surface of the extension section is greater than an average thickness of the extension section, and the radial direction is a direction perpendicular to the optical axis, and the width of the top surface is a size of the top surface in the radial direction.

5. The under-screen camera assembly according to claim 4, wherein, the extension portion is formed by extending the top of the extension section inwardly and/or outwardly along a radial direction, and the inward direction is the direction of the optical axis.

6. The under-screen camera assembly of claim 1, wherein, the lens group installation section and the extension section are integrally molded based on an injection molding process.

7. The under-screen camera assembly of claim 1, wherein, the lens barrel is made of a light-shielding material.

8. The under-screen camera assembly of claim 1, wherein the top surface of the extension section and the bottom surface of the organic light-emitting diode display screen are fixed together by adhering.

9. The under-screen camera assembly according to claim 1, wherein, the under-screen camera area and the non-under-screen camera area constitute a virtual diaphragm of the camera module, and the under-screen camera area forms a light through hole of the virtual diaphragm, and the non-under-screen camera area forms a light-shielding portion of the virtual diaphragm.

10. The under-screen camera assembly according to claim 1, wherein, no physical diaphragm is arranged between each lens of the lens group.

11. The under-screen camera assembly of claim 1, wherein, a pixel density of the under-screen camera area is set to be smaller than a pixel density of the non-under-screen camera area.

12. The under-screen camera assembly according to claim 1, wherein, a pixel pitch of the under-screen camera area is set to be greater than a pixel pitch of the non-under-screen camera area, and the pixel pitch is a pitch between light-emitting structures of adjacent pixels of the organic light-emitting diode display screen.

13. The under-screen camera assembly according to claim 1, wherein, the under-screen camera assembly further include a first control unit, which is used to control both of the under-screen camera area and the non-under-screen camera area to display images in the non-working state of the camera module; and to control the display function of the under-screen camera area to be turned off in the working state of the camera module.

14. The under-screen camera assembly according to claim 1, wherein, the under-screen camera assembly further include a second control unit, which is used to compensate brightness of the under-screen camera area when both of the under-screen camera area and the non-under-screen camera area display images.

15. The under-screen camera assembly according to claim 1, wherein, the under-screen camera assembly further include a second control unit, which is used to compensate a display parameter of the under-screen camera area when both of the under-screen camera area and the non-under-screen camera area display images, so that the displayed image transits smoothly between the under-screen camera area and the non-under-screen camera area.

16. A terminal device, characterized by comprising the under-screen camera assembly according to claim 1.

17. The terminal device according to claim 16, wherein, the camera module is used as a front camera module of the terminal device, and the organic light-emitting diode display screen is used as a display panel on the front of the terminal device.

* * * * *